(12) United States Patent
Kawamura et al.

(10) Patent No.: US 10,676,635 B2
(45) Date of Patent: *Jun. 9, 2020

(54) SILICONE-MODIFIED EPOXY RESIN COMPOSITION AND SEMICONDUCTOR DEVICE

(71) Applicant: Shin-Etsu Chemical Co., Ltd., Tokyo (JP)

(72) Inventors: Norifumi Kawamura, Annaka (JP); Shoichi Osada, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/168,005

(22) Filed: Oct. 23, 2018

(65) Prior Publication Data

US 2019/0144704 A1 May 16, 2019

(30) Foreign Application Priority Data

Nov. 10, 2017 (JP) .................................. 2017-217201

(51) Int. Cl.
| | | |
|---|---|---|
| C09D 163/00 | (2006.01) | |
| C08G 59/30 | (2006.01) | |
| C08G 59/32 | (2006.01) | |
| H01L 23/29 | (2006.01) | |
| C08K 3/04 | (2006.01) | |
| C08K 3/36 | (2006.01) | |
| C08G 59/62 | (2006.01) | |
| C08L 83/06 | (2006.01) | |
| C08G 77/14 | (2006.01) | |
| C08G 77/16 | (2006.01) | |

(52) U.S. Cl.
CPC ......... *C09D 163/00* (2013.01); *C08G 59/306* (2013.01); *C08G 59/3281* (2013.01); *C08G 59/621* (2013.01); *C08K 3/04* (2013.01); *C08K 3/36* (2013.01); *C08L 83/06* (2013.01); *H01L 23/296* (2013.01); *C08G 77/14* (2013.01); *C08G 77/16* (2013.01)

(58) Field of Classification Search
CPC ..................................................... C09D 163/00
See application file for complete search history.

(56) References Cited

U.S. PATENT DOCUMENTS

| 4,877,822 | A | * | 10/1989 | Itoh | ........................ | C08G 59/027 |
|---|---|---|---|---|---|---|
| | | | | | | 523/433 |
| 7,095,125 | B2 | * | 8/2006 | Osada | ...................... | C08L 63/00 |
| | | | | | | 257/793 |
| 2010/0140537 | A1 | * | 6/2010 | Morita | ..................... | C08L 83/04 |
| | | | | | | 252/78.3 |
| 2016/0244571 | A1 | * | 8/2016 | Mittal | ...................... | C08G 77/50 |
| 2016/0251511 | A1 | * | 9/2016 | Osada | ...................... | C08L 63/00 |
| | | | | | | 523/433 |
| 2017/0210913 | A1 | * | 7/2017 | Dubey | ................. | C09D 5/1675 |
| 2018/0334567 | A1 | * | 11/2018 | Kawamura | ............. | C08L 83/10 |
| 2019/0048184 | A1 | * | 2/2019 | Takimoto | .................. | C08K 3/22 |

FOREIGN PATENT DOCUMENTS

| JP | 2005-213299 A | 8/2005 |
|---|---|---|
| JP | 2008-143950 A | 6/2008 |
| JP | 2010-31126 A | 2/2010 |
| JP | 2013-203865 A | 10/2013 |

* cited by examiner

*Primary Examiner* — Megan McCulley
(74) *Attorney, Agent, or Firm* — Birch, Stewart, Kolasch & Birch, LLP

(57) ABSTRACT

The invention provides a silicone-modified epoxy resin composition comprising a silicone-modified epoxy resin having at least two epoxy groups, obtained from hydrosilylation reaction of an alkenyl-containing epoxy compound with an organopolysiloxane, a silicone-modified phenolic resin having at least two phenolic hydroxyl groups, obtained from hydrosilylation reaction of an alkenyl-containing phenol compound with an organopolysiloxane, black pigment, and an inorganic filler. Because of excellent tracking resistance, the epoxy resin composition is suited for encapsulating semiconductor devices.

5 Claims, No Drawings

SILICONE-MODIFIED EPOXY RESIN COMPOSITION AND SEMICONDUCTOR DEVICE

CROSS-REFERENCE TO RELATED APPLICATION

This non-provisional application claims priority under 35 U.S.C. § 119(a) on Patent Application No. 2017-217201 filed in Japan on Nov. 10, 2017, the entire contents of which are hereby incorporated by reference.

TECHNICAL FIELD

This invention relates to a silicone-modified epoxy resin composition having improved tracking resistance and a semiconductor device encapsulated therewith.

BACKGROUND ART

The current mainstream of semiconductor devices including diodes, transistors, ICs, and LSIs is of the resin encapsulation type. Epoxy resins have superior moldability, adhesion, electrical properties, mechanical properties, and moisture resistance to other thermosetting resins. It is thus widely spread to encapsulate semiconductor devices with epoxy resin compositions. Over the decade, the electronic equipment market is under the increasing trend toward compact size, light weight and high performance of semiconductor devices and high integration of semiconductor chips. Since the spacing between interconnects or wires within the semiconductor is accordingly reduced, the resin composition is required to have higher reliability.

As a result of reduction of size and profile, the width of circuit pitch and the distance between lead terminals are reduced. This makes it difficult to secure a space distance and creepage distance sufficient to provide electric insulation therebetween. For the encapsulant as the insulator, improvements in performance, especially tracking resistance are required.

In the prior art, several means for enhancing tracking resistance of encapsulants such as epoxy resin compositions are known. For example, Patent Document 1 proposes to increase the amount of inorganic filler blended, Patent Document 2 describes to blend a small amount of silicone rubber powder in addition to an inorganic filler, Patent Document 3 discloses a mixture of an alicyclic epoxy resin having a cyclohexane polyether skeleton, but free of a benzene skeleton susceptible to formation of conductive paths and a dicyclopentadiene type phenolic resin, and Patent Document 4 describes the use of an aminotriazine-modified novolak resin or melamine resin as curing agent. On the other hand, the progress is toward semiconductor chips of thin profile and wires of reduced size, suggesting that flow during molding is an important factor. Increasing the amount of inorganic filler blended is effective for, the purpose of enhancing tracking resistance at the sacrifice of flow during molding. Also, while aromatic moiety makes a substantial contribution to the heat resistance of resin compositions, non-aromatic epoxy resins invite a lowering of heat resistance, giving detrimental impact on reliability.

CITATION LIST

Patent Document 1: JP-A 2008-143950
Patent Document 2: JP-A 2013-203865
Patent Document 3: JP-A 2005-213299
Patent Document 4: JP-A 2010-031126

DISCLOSURE OF INVENTION

An object of the invention is to provide a silicone-modified epoxy resin composition having improved tracking resistance and a semiconductor device encapsulated with the resin composition.

The inventors have found that the outstanding problems are solved by a silicone-modified epoxy resin composition comprising a specific silicone-modified epoxy resin, a specific, silicone-modified phenolic resin, a black pigment, and an inorganic filler.

In one aspect, the invention provides a silicone-modified epoxy resin composition comprising:

(A) a silicone-modified epoxy resin having at least two epoxy groups, obtained from hydrosilylation reaction of an alkenyl-containing epoxy compound with an organopolysiloxane having the average compositional formula (1):

$$H_a R_b SiO_{(4-a-b)/2} \quad (1)$$

wherein R is each independently a $C_1$-$C_{10}$ monovalent hydrocarbon group, a is a positive number: $0.01 \leq a \leq 1$, b is a positive number: $1 \leq b \leq 3$, meeting $1.01 \leq a+b < 4$, (B) a silicone-modified phenolic resin having at least two phenolic hydroxyl groups, obtained from hydrosilylation reaction of an alkenyl-containing phenol compound having the formula (2):

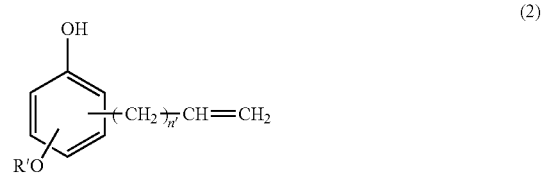

(2)

wherein R' is $C_1$-$C_{10}$ alkyl and n' is an integer of 0 to 4, with an organopolysiloxane having the average compositional formula (1), (C) a black pigment, and
(D) an inorganic filler exclusive of the black pigment (C).

In a preferred embodiment, the organopolysiloxane in components (A) and (B) is at least one compound selected from compounds having the formulae (a), (b) and (c).

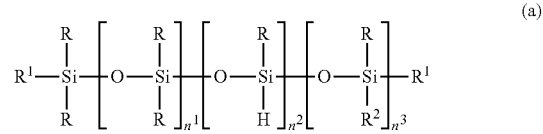

(a)

Herein R is as defined above, $R^1$ is hydrogen or a group as defined for R, $n^1$ is an integer of 0 to 200, $n^2$ is an integer of 0 to 2, $n^3$ is an integer of 0 to 10, with the proviso that $n^1$, $n^2$ and $n^3$ are not equal to 0 at the same time, and $R^2$ is a group having the formula (a'):

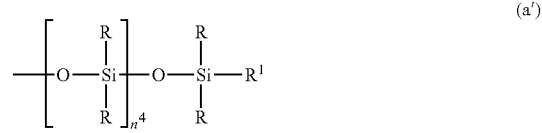

(a')

wherein R and $R^1$ are as defined above, $n^4$ is an integer of 0 to 10, siloxane units each in brackets may be randomly bonded or form blocks, the compound of formula (a) containing at least two silicon-bonded hydrogen atoms per molecule.

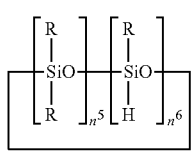

(b)

Herein R is as defined above, $n^5$ is an integer of 0 to 10, $n^6$ is an integer of 2 to 4, meeting $3 \leq n^5 + n^6 \leq 12$, the arrangement of siloxane units each in brackets is not limited.

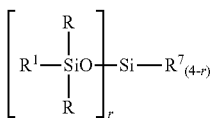

(c)

Herein R and $R^1$ are as defined above, r is an integer of 0 to 3, and $R^7$ is hydrogen or a $C_1$-$C_{10}$ organic group, the compound of formula (c) containing at least two silicon-bonded hydrogen atoms per molecule.

In a preferred embodiment, the alkenyl-containing phenol compound having formula (2) has the following formula.

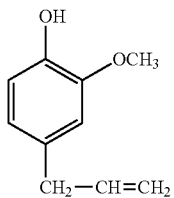

In a preferred embodiment, the inorganic filler (D) is present in an amount of 150 to 1,500 parts by weight per 100 parts by weight of components (A) and (B) combined and 60 to 94% by weight of the total weight of the composition.

Also contemplated herein is a semiconductor device encapsulated with a cured product of the silicone-modified epoxy resin composition defined above.

Advantageous Effects of Invention

The resin composition of the invention has improved tracking resistance because a combination of a specific silicone-modified epoxy resin as a base component with a specific silicone-modified phenolic resin as a curing agent component is effective for suppressing formation of carbide conductive paths which can cause short-circuiting.

DESCRIPTION OF PREFERRED EMBODIMENTS

The notation (Cn-Cm) means a group containing from n to m carbon atoms per group.

The resin composition of the invention is defined as comprising components (A) to (D) as essential components, (A) a silicone-modified epoxy resin having at least two epoxy groups, obtained from hydrosilylation reaction of an alkenyl-containing epoxy compound with an organopolysiloxane having the average compositional formula (1), (B) a silicone-modified phenolic resin having at least two phenolic hydroxyl groups, obtained from hydrosilylation reaction of an alkenyl-containing phenol compound having the formula (2):

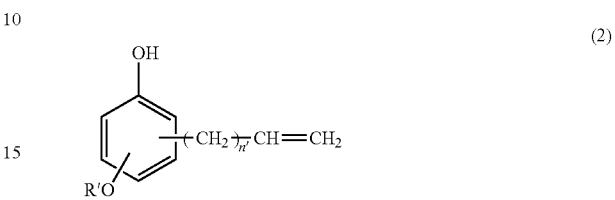

(2)

wherein R' is $C_1$-$C_{10}$ alkyl and n' is an integer of 0 to 4, with an organopolysiloxane having the average compositional formula (1), (C) a black pigment, and (D) an inorganic filler exclusive of the black pigment (C).

(A) Silicone-Modified Epoxy Resin

Component (A) is a copolymer having at least two epoxy groups, obtained from hydrosilylation reaction of an alkenyl-containing epoxy compound with a hydrogenorganopolysiloxane having the average compositional formula (1). The inclusion of the copolymer ensures that the resin composition has high heat resistance, hygroscopicity, tracking resistance, and flow.

The alkenyl-containing epoxy compound used herein is not particularly limited as long as it has epoxy and alkenyl groups and is generally used in semiconductor encapsulating resin compositions.

Suitable epoxy resins include cresol-novolak type epoxy resins, biphenyl type epoxy resins, dicyclopentadiene-modified phenol type epoxy resins, biphenyl aralkyl type epoxy resins, triphenylalkane type epoxy resins, naphthol type epoxy resins, triazine derivative epoxy resins, and epoxycyclohexyl type epoxy resins. Such epoxy resins further having alkenyl groups such as vinyl or allyl are useful.

Of the foregoing epoxy compounds, compounds of the following structural formulae are preferred because of effective working and tracking resistance.

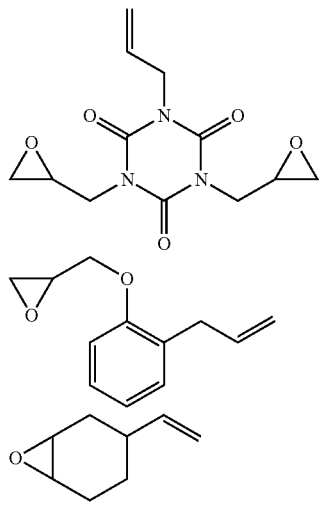

The hydrogenorganopolysiloxane has the average compositional formula (1):

$$H_aR_bSiO_{(4-a-b)/2} \quad (1)$$

wherein R is each independently a $C_1$-$C_{10}$ monovalent hydrocarbon group, a is a positive number: $0.01 \leq a \leq 1$, b is a positive number: $1 \leq b \leq 3$, meeting $1.01 \leq a+b < 4$. Specifically, the hydrogenorganopolysiloxane of formula (1) has at least two SiH groups, preferably 2 to 10 SiH groups per molecule. In formula (1), R is a $C_1$-$C_{10}$, preferably $C_1$-$C_6$, monovalent hydrocarbon group, examples of which include alkyl groups such as methyl, ethyl, propyl, isopropyl, butyl, isobutyl, tert-butyl, pentyl, neopentyl, hexyl, octyl, nonyl, and decyl, aryl groups such as phenyl, tolyl, xylyl and naphthyl, and aralkyl groups such as benzyl, phenylethyl, and phenylpropyl. Inter alia, methyl, ethyl and phenyl are preferred. Also useful are substituted forms of the hydrocarbon groups in which some hydrogen is substituted by halogen such as fluorine, bromine or chlorine.

The organopolysiloxane having the average compositional formula (1) may be linear, cyclic or branched. For example, those having the following formulae (a), (b) and (c) are included.

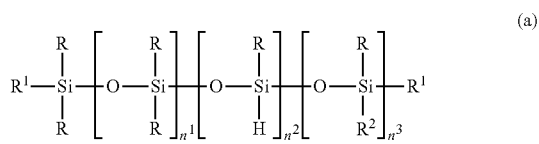
(a)

In formula (a), R is as defined above, $R^1$ is hydrogen or a group as defined for R, and $R^2$ is a group having the formula (a').

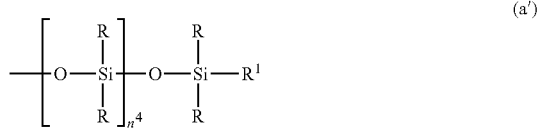
(a')

In formula (a'), R and $R^1$ are as defined above, $n^4$ is an integer of 0 to 10, preferably 0, 1 or 2.

In formula (a), $n^1$ is an integer of 0 to 200, preferably 0 to 20; $n^2$ is an integer of 0 to 2, preferably 0 or 1; $n^3$ is an integer of 0 to 10, preferably 0 to 6; with the proviso that $n^1$, $n^2$ and $n^3$ are not equal to 0 at the same time. Notably, siloxane units each in brackets. [ ] may be randomly bonded or form blocks. The compound of formula (a) contains at least two silicon-bonded hydrogen atoms (SiH groups) per molecule, preferably 2 to 10 SiH groups per molecule. Then in formula (a) wherein $n^2 = 0$, at least two $R^1$ in formulae (a) and (a') are hydrogen.

(b)

In formula (b), R is as defined above, $n^5$ is an integer of 0 to 10, preferably 0 to 6 $n^6$ is an integer of 1 to 4, preferably 2 to 4, meeting $3 \leq n^5+n^6 \leq 12$. The arrangement of siloxane units each in brackets is not limited.

(c)

In formula (c), R and $R^1$ are as defined above, r is an integer of 0 to 3, and $R^7$ is hydrogen or a $C_1$-$C_{10}$, preferably $C_1$-$C_6$ organic group, typically monovalent hydrocarbon group. The compound of formula (c) contains at least two silicon-bonded hydrogen atoms per molecule. Then in formula (c) wherein r=0, at least two $R^7$ are hydrogen.

Examples of the group $R^7$ include hydrogen, alkyl groups such as methyl, ethyl, propyl, isopropyl, butyl, isobutyl, tert-butyl, pentyl, neopentyl, hexyl, octyl, nonyl, and decyl, alkoxy groups such as methoxy, ethoxy, propoxy, isopropoxy, butoxy, isobutoxy, and tert-butoxy, aryl groups such as phenyl, tolyl, xylyl and naphthyl, and aralkyl groups such as benzyl, phenylethyl, and phenylpropyl. Inter alia, hydrogen, methyl and phenyl are preferred.

Of the hydrogenorganopolysiloxanes, both end hydrogenmethylpolysiloxanes and both end hydrogenmethylphenylpolysiloxanes are preferred. For example, the compounds shown below are preferred.

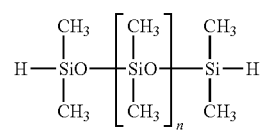

Herein n is an integer of 1 to 100.

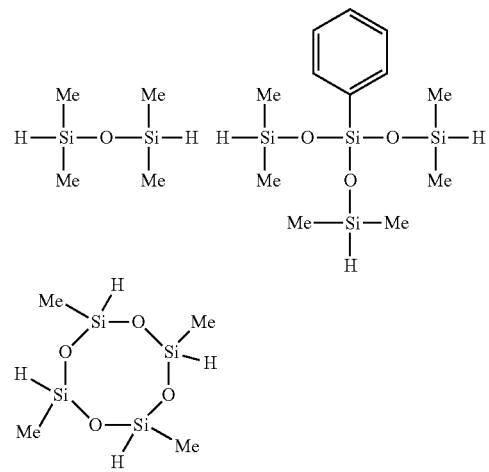

The hydrosilylation reaction for forming the silicone-modified epoxy resin as component (A) may accord with any prior art well-known techniques. For example, the reaction may be carried out by heating in the presence of a platinum base catalyst such as chloroplatinic acid. Base hydrosilylation reaction is typically carried out in an inert solvent such as benzene or toluene at an elevated temperature of 60 to 120° C. A proportion of the epoxy compound and the polysiloxane is such that the number of SiH groups on the polysiloxane per alkenyl group on the epoxy compound may be at least 1.0, preferably 1.5 to 5.0.

(B) Silicone-Modified Phenolic Resin

Component (B) is a silicone-modified phenolic resin serving as a curing agent by reacting with epoxy groups. It is an addition reaction product having at least two phenolic hydroxyl groups, obtained from hydrosilylation reaction of an alkenyl-containing phenol compound having the formula (2):

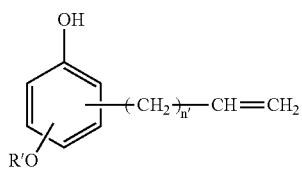

(2)

wherein R' is $C_1$-$C_{10}$ alkyl and n' is an integer of 0 to 4 with an organopolysiloxane having the average compositional formula (1) defined above.

The inclusion of the copolymer ensures that the resin composition has high heat resistance, hygroscopicity, tracking resistance, and flow. Since only little volatiles are emitted upon curing of the composition, the formation of voids due to bubbling is minimized.

In formula (2), R' is a $C_1$-$C_{10}$ alkyl group, such as methyl, ethyl, propyl, isopropyl, butyl, isobutyl, tert-butyl, pentyl, neopentyl, hexyl, octyl, nonyl, and decyl, with methyl being most preferred. The subscript n' is an integer of 0 to 4, preferably 0 or 1, most preferably 1.

Of the phenol compounds, the compound having the following structural formula:

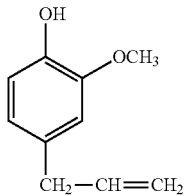

is preferred because of minimized volatilization of resin component, effective working, and tracking resistance.

The use of an alkenyl-containing phenol compound having formula (2) as one constituent of the silicone-modified phenolic resin or component (B) is effective for controlling resin decomposition by internal reaction, which leads to a suppression of volatilization of decomposed products.

The hydrogenorganopolysiloxane to be reacted with the alkenyl-containing phenol compound may be of the same structure as defined and exemplified for the polysiloxane used in component (A).

The hydrosilylation reaction for forming the silicone-modified phenolic resin as component (B) may accord with any prior art well-known techniques. For example, the reaction may be carried out by heating in the presence of a platinum base catalyst such as chloroplatinic acid. The hydrosilylation reaction is typically carried out in an inert solvent such as benzene or toluene at an elevated temperature of 60 to 120° C. A proportion of the phenol compound and the polysiloxane is such that the number of SiH groups on the polysiloxane per alkenyl group on the phenol compound may be at least 1.0, preferably 1.5 to 5.0.

The silicone-modified epoxy resin (A) as base and the silicone-modified phenolic resin (B) as curing agent are preferably combined such that a ratio of phenolic hydroxyl groups to epoxy groups ranges from 0.6/1 to 1.6/1, more preferably from 0.8 to 1.3.

(C) Black Pigment

Component (C) is a black pigment for coloring the resin composition black. Examples of the pigment used herein include, but are not limited to, carbon black, furnace black and acetylene black. Inter alia, carbon black is preferred. Now that the resin composition is colored black, semiconductor devices fabricated using the composition as semiconductor encapsulant are given satisfactory outer appearance and laser marking performance comparable to those of semiconductor devices encapsulated with prior art epoxy resin compositions.

The pigment is blended in an amount of preferably at least 1 part by weight, more preferably at least 3 parts by weight per 100 parts by weight of the total of resin components, i.e., components (A) and (B) in the resin composition. At least 1 pbw of the pigment is preferred in that luster does not become too high, the outer appearance fault that a trace of a semiconductor chip reflects on the semiconductor package surface is avoided, the color is fully black, and laser marking performance is satisfactory. The amount of the pigment is preferably up to 10 parts by weight.

(D) Inorganic Filler

Component (D) is an inorganic filler. Suitable fillers include silicas such as fused silica, crystalline silica, and cristobalite, as well as alumina, silicon nitride, aluminum nitride, boron nitride, titanium oxide, glass fibers, magnesium oxide, and zinc oxide. Notably, the black pigment as component (C) is excluded.

Although the inorganic filler is not particularly limited in size and shape, the filler preferably has an average particle size of 1 to 50 μm, more preferably 4 to 20 μm. It is noted that the average particle size is a value of laser diffraction particle size distribution measurement such as by Cilas® laser.

The inorganic filler preferably has a chloride ion content of up to 10 ppm, more preferably up to 5 ppm and a sodium ion content of up to 10 ppm, more preferably up to 5 ppm, when impurities are extracted from the filler in a concentration of sample 10 g/water 50 g under conditions: 125° C., 2.1 atm., and 20 hours. As long as the impurity content is within the range, there is no risk that the semiconductor device encapsulated with the filled composition undergoes a decline of humidity resistance.

The inorganic filler is blended in an amount of preferably 150 to 1,500 parts by weight, more preferably 250 to 1,200 parts by weight per 100 parts by weight of the total of components (A) and (B). Also preferably the inorganic filler accounts for 60 to 94% by weight, more preferably 70 to 92% by weight, even more preferably 75 to 90% by weight of the total weight of the resin composition.

Prior to use, the inorganic filler is preferably surface treated with coupling agents for enhancing the bond strength between the resin component and the filler. Suitable coupling agents are silane coupling agents and titanate coupling agents. Preferred are silane coupling agents including epoxy silanes such as γ-glycidoxypropyltrimethoxysilane, γ-glycidoxypropylmethyldiethoxysilane, β-(3,4-epoxycyclohexyl) ethyltrimethoxysilane; N-β-(aminoethyl)-γ-aminopropyltrimethoxysilane, the reaction product of imidazole with γ-glycidoxypropyltrimethoxysilane; aminosilanes such as γ-aminopropyltriethoxysilane and N-phenyl-γ-aminopropyltrimethoxysilane; mercaptosilanes such as γ-mercaptosilane and γ-episulfidoxypropyltrimethoxysilane. The amount of the coupling agent used and the surface treatment mode are not particularly limited and may accord with the standard technology.

(E) Other Components

In addition to the essential components (A) to (D), the resin composition may further contain various additives such as cure accelerators, parting agents, flame retardants, ion trapping agents, antioxidants, and tackifiers, if necessary.

The cure accelerator is not particularly limited as long as it can accelerate curing reaction. Suitable cure accelerators include phosphorus compounds such as triphenylphosphine, tributylphosphine, tri(p-methylphenyl)phosphine, tri(p-nonylphenyl)phosphine, triphenylphosphine-triphenylborane, tetraphenylphosphine tetraphenylborate, tetraphenylphosphine tetra(p-methylphenyl)borate, and the adduct of triphenylphosphine and p-benzoquinone; tertiary amine compounds such as triethylamine, benzyldimethylamine, α-methylbenzyldimethylamine, and 1,8-diazabicyclo[5.4.0]undecene-7; and imidazole compounds such as 2-methylimidazole, 2-phenylimidazole, and 2-phenyl-4-methylimidazole, which may be used alone or in admixture. The cure accelerators may also be used in modified forms, for example, porous silica impregnated with the cure accelerator and the cure accelerator coated with a thermoplastic resin such as polymethyl methacrylate. Inter alia, an imidazole compound having high basicity which is coated with a thermoplastic resin is preferred. The cure accelerator may be used in an effective amount, which is preferably 0.1 to 5 parts by weight, more preferably 0.5 to 2 parts by weight per 100 parts by weight of the total of components (A) and (B), but not limited thereto.

Any desired well-known parting agents may be used. Suitable parting agents include natural wax base parting agents such as carnauba wax, rice wax, candelilla wax; synthetic high molecular weight parting agents such as polyethylene, polyethylene oxide, polypropylene; fatty acid derivative base parting agents such as lauric acid, stearic acid, palmitic acid, behenic acid, cerotic acid, montanic acid, stearates, stearamides, ethylene bis(stearamide); and ethylene-vinyl acetate copolymers. The parting agents may be used alone or in admixture. The parting agent is preferably used in an amount of 0.5 to 5 parts by weight, more preferably 1 to 3 parts by weight per 100 parts by weight of the total of components (A) and (B).

Any desired well-known flame retardants may be used. Suitable flame retardants include phosphazene compounds, silicone compounds, zinc, molybdate-carrying talc, zinc molybdate-carrying zinc oxide, aluminum hydroxide, magnesium hydroxide, molybdenum oxide, and antimony trioxide. The flame retardant is preferably used in an amount of 2 to 20 parts by weight, more preferably 3 to 10 parts by weight per 100 parts by weight of the total of components (A) and (B).

Any desired well-known ion trapping agents may be used. Suitable ion trapping agents include hydrotalcites, bismuth hydroxide, and rare earth oxides. The ion trapping agent is preferably used in an amount of 1 to 10 parts by weight, more preferably 1.5 to 5 parts by weight per 100 parts by weight of the total of components (A) and (B).

Any desired well-known tackifiers may be used. For example, coupling agents as used for the surface treatment of inorganic fillers may be used as the tackifier. The tackifier may be used alone or in admixture. The tackifier is preferably used in an amount of 0.2 to 5 parts by weight, more preferably 0.5 to 3 parts by weight per 100 parts by weight of the total of components (A) and (B).

The resin composition may be prepared by any desired methods. For example, the resin composition may be obtained by stirring, dissolving, mixing and dispersing the essential components and optional component (E) simultaneously or separately, while heat treating if necessary, and in some cases, by further adding optional components to the mixture, mixing, stirring and dispersing them. Although the machine used in the mixing step is not particularly limited, suitable machines include an automated mortar, two-roll mill, three-roll mill, ball mill, continuous extruder, planetary mixer, and MassColloider, equipped with stirring and heating units. These machines may be used in a suitable combination if desired.

The resin composition is useful as an encapsulant for semiconductor devices including transistor, module, DIP, SO, flat pack and ball grid array type devices. The method for encapsulating a semiconductor device with the resin composition is not particularly limited, and any of prior art molding methods such as transfer molding, injection molding and casting may be used. The resin composition is preferably molded under suitable conditions, typically at 160 to 190° C. for 45 to 300 seconds and post-cured at 170 to 250° C. for 2 to 16 hours.

EXAMPLE

Examples of the invention are given below byway of illustration and not by way of limitation. In the structural formula, Me stands for methyl.

Examples 1 to 4

Resin compositions were prepared by combining components (A) and (B) synthesized in Synthesis Examples 1 to 4 and the components shown below in accordance with the formulation described in Table 1, melt mixing them on a hot two-roll mill until uniform, cooling and grinding.

(A) Silicone-Modified Epoxy Resins E-01, E-02

Synthesis Example 1

A 1-L separable flask was charged with 0.16 g of a 0.5 wt % chloroplatinic acid toluene solution, 80 g of toluene, and 296 g of o-allylphenyl glycidyl ether (OAP-EP by Shikoku Chemicals Corp.), followed by stirring and heating at an internal temperature of 80° C. Thereafter, 110 g of 1,1,3,3-tetramethyldisiloxane (Shin-Etsu Chemical Co., Ltd.) was added dropwise over 30 minutes, and reaction run at 90° C. for 4 hours. The resulting toluene solution was distilled under reduced pressure, obtaining a silicone-modified epoxy resin E-01 having a structure of the formula (3) shown below. The resin E-01 had an epoxy equivalent of 257 g/eq.

(3)

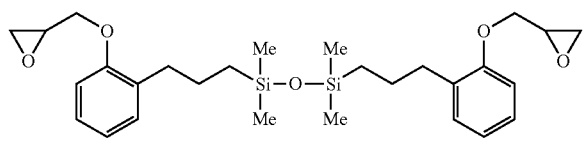

Synthesis Example 2

A 2-L separable flask was charged with 1.68 g of a 0.5 wt % chloroplatinic acid toluene solution, 200 g of toluene, and 596.06 g (2.4 mol) of 1,2-epoxy-4-vinylcyclohexane, followed by stirring and heating at an internal temperature of 80° C. Thereafter, 240.51 g (1 mol) of 2,4,6,8-tetramethylcyclotetrasiloxane was added dropwise over 1 hour, and reaction run at 100° C. for 2 hours. The resulting toluene solution was distilled under reduced pressure, obtaining a silicone-modified epoxy resin E-02 having a structure of the formula (4) shown below. The resin E-02 had an epoxy equivalent of 200 g/eq.

(4)

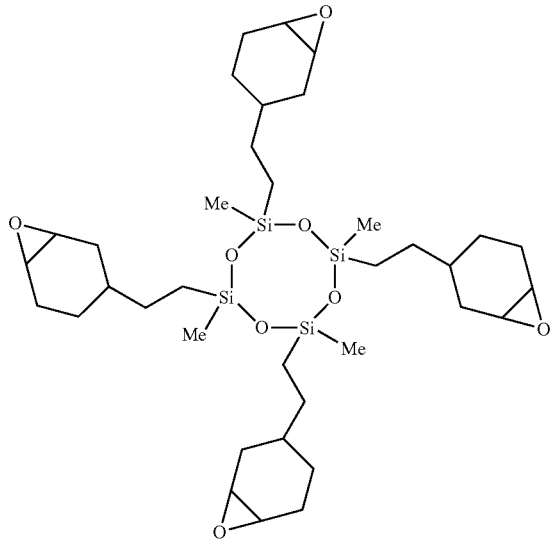

(B) Silicone-Modified Phenolic Resins P-01, P-02

Synthesis Example 3

A 1-L separable flask was charged with 0.14 g of a 0.5 wt % chloroplatinic acid toluene solution, 80 g of toluene, and 293 g of 4-allyl-2-methoxyphenol (Tokyo Chemical Industry Co., Ltd.), followed by stirring and heating at an internal temperature of 70° C. Thereafter, 113 g of 2,4,6,8-tetramethylcyclotetrasiloxane (KF-9902 by Shin-Etsu Chemical Co., Ltd.) was added dropwise over 30 minutes, and reaction run at 90° C. for 4 hours. The resulting toluene solution was distilled under reduced pressure, obtaining a silicone-modified phenolic resin P-01 having a structure of the formula (5) shown, below. The resin P-01 had a hydroxyl equivalent of 224 g/eq.

(5)

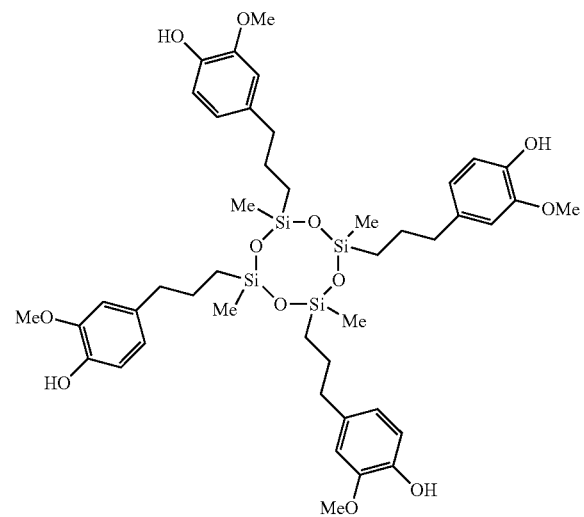

Synthesis Example 4

A 1-L separable flask was charged with 0.13 g of a 0.5 wt % chloroplatinic acid toluene solution, 80 g of toluene, and 239 g of 4-allyl-2-methoxyphenol (Tokyo Chemical Industry Co., Ltd.), followed by stirring and heating at an internal temperature of 80° C. Thereafter, 103 g of 1,1,3,3-tetramethyldisiloxane (HM-H by Shin-Etsu Chemical Co., Ltd.) was added dropwise over 30 minutes, and reaction run at 90° C. for 4 hours. The resulting toluene solution was distilled under reduced pressure, obtaining a silicone-modified phenolic resin P-02 having a structure of the formula (6) shown below. The resin P-02 had a hydroxyl equivalent of 231 g/eq.

(6)

$$\text{MeO} \begin{array}{c} \\ \\ \text{HO} \end{array} \hspace{-0.2cm} \text{—} \hspace{-0.2cm} \text{CH}_2\text{CH}_2\text{CH}_2 \hspace{-0.2cm} \underset{\underset{\text{Me}}{|}}{\overset{\overset{\text{Me}}{|}}{\text{Si}}} \text{—O—} \underset{\underset{\text{Me}}{|}}{\overset{\overset{\text{Me}}{|}}{\text{Si}}} \text{—CH}_2\text{CH}_2\text{CH}_2 \hspace{-0.2cm} \begin{array}{c} \\ \\ \text{OH} \end{array} \hspace{-0.2cm} \text{OMe}$$

(C) Black Pigment
  carbon black (3230MJ by Mitsubishi Chemical Corp.)
(D) Inorganic Filler
  fused silica powder (average particle size 16 μm, by Tatsumori Ltd.)
(E) Other Components
Cure Accelerator
  triphenyl phosphine (TPP® by Hokkou Chemical Co., Ltd.)
  2-ethyl-4-methylimidazole (Curezol® 2E4MZ by Shikoku Chemicals Corp.)
Other Additives
  carnauba wax (TOWAX-131 by Toa Kasei Co., Ltd.)
  Silane coupling agent which is a 1:5 mixture of 3-mercaptopropyltrimethoxysilane (KBM-803 by Shin-Etsu Chemical Co., Ltd.) and 3-glycidoxypropyltrimethoxysilane (KBM-403 by Shin-Etsu Chemical Co., Ltd.)

Comparative Examples 1, 2 and 4

Resin compositions were prepared by combining the same components as in Example 1, except silicone-modified phenolic resin P-03 in Synthesis Example 5 below as the resin corresponding to component (B), in accordance with the formulation in Table 1, melt mixing them on a hot two-roll mill until uniform, cooling and grinding.

Synthesis Example 5

A 1-L separable flask was charged with 0.16 g of a 0.5 wt % chloroplatinic acid toluene solution, 80 g of toluene, and 266 g of 2-allylphenol (Yokkaichi Chemical Co., Ltd.), followed by stirring and heating at an internal temperature of 80° C. Thereafter, 140 g of 1,1,3,3-tetramethyldisiloxane (HM-H by Shin-Etsu Chemical Co., Ltd.) was added dropwise over 30 minutes, and reaction run at 90° C. for 3 hours. The resulting toluene solution was distilled under reduced pressure, obtaining a silicone-modified phenolic resin P-03 having a structure of the formula (7) shown below. The resin P-03 had a hydroxyl equivalent of 201 g/eq.

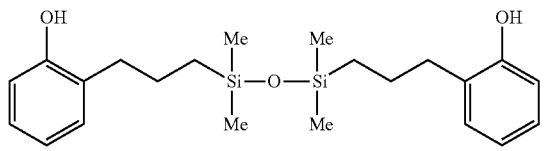

(7)

Comparative Example 3

A resin composition was prepared by combining the epoxy resin and phenolic resin, shown below, as the resins corresponding to components (A) and (B), in accordance with the formulation in Table 1, melt mixing them on a hot two-roll mill until uniform, cooling and grinding.

Epoxy Resin
  polyfunctional epoxy resin (EPPN-501H by Nippon Kayaku Co., Ltd.)

Phenolic Resin
  phenol novolak resin (TD-2131 by DIC Corp.)

The thus obtained resin compositions were evaluated by the following tests.

[Tests]

Heat Loss

First the tare (W1) of a clean aluminum dish is weighed by a precision balance (reading limit 0.1 mg). A sample is placed on the aluminum dish, and the weight (W2) of the sample-loaded aluminum dish is weighed. The sample-loaded aluminum dish is held in a thermostatic chamber at 180° C. for 4 hours, after which the aluminum dish is taken out and allowed to cool down to room temperature. the weight (W3) of the sample-loaded aluminum dish is weighed again. A weight loss on heating of the sample is computed according to the following formula.

Heat loss (wt %)=[(W3−W1)/(W2−W1)]×100

W1: aluminum dish weight (g)
W2: aluminum dish weight+green sample weight (g)
W3: aluminum dish weight+heated sample weight (g)

Tracking Resistance

The resin composition was molded into a specimen of 50 mm diameter×3 mm thick according to JIS C 2134: 2007 and post cured at 180° C. for 4 hours. The specimen was held in a 25° C./50% RH atmosphere for 48 hours. Two platinum electrodes were placed in contact with the surface of the specimen. While a voltage was' applied between the electrodes, a 0.1 wt % ammonium chloride aqueous solution was dropped on the specimen at intervals of one droplet every 30 seconds. The test used five specimens (N=5). The value of maximum voltage against which the specimen resisted without tracking breakdown or sustaining flame during the measurement period of 50 droplets was determined as comparative tracking index (CTI). With the fixed voltage of 600 V applied, the resin composition was evaluated for tracking resistance by counting the number of droplets of 0.1 wt % ammonium chloride aqueous solution.

Void Formation Upon Curing

A 10-g sample of each resin composition was weighed, placed on an aluminum dish, and molded by successively heating at 125° C. for 1 hour, at 150° C. for 1 hour and at 180° C. for 4 hours. The cured product was visually observed for void formation and rated according to the following criteria.
  ○: no voids observed
  Δ: only several voids observed
  X: 10 or more voids observed

TABLE 1

| Formulation (parts by weight) | | | Example 1 | Example 2 | Example 3 | Example 4 | Comparative Example 1 | Comparative Example 2 | Comparative Example 3 |
|---|---|---|---|---|---|---|---|---|---|
| (A) | Silicone-modified epoxy resin | E-01 | 53.9 | | | 53.9 | 57.3 | | |
| | | E-02 | | 46.7 | 45.9 | | | 49.4 | |
| | Epoxy resin | polyfunctional epoxy resin | | | | | | | 60.0 |
| (B) | Silicone-modified phenolic resin | P-01 | | 53.3 | | | | | |
| | | P-02 | 46.1 | | 54.1 | 46.1 | | | |
| | | P-03 | | | | | 42.7 | 50.6 | |
| | Phenolic resin | phenol novolac resin | | | | | | | 40.0 |
| (C) | Black pigment | carbon black | 1.5 | 1.5 | 1.5 | 1.5 | 1.5 | 1.5 | 1.5 |
| (D) | Inorganic filler | fused silica powder | 430 | 430 | 430 | 129 | 430 | 430 | 430 |
| (E) | Other additives | triphenyl-phosphine | | | | | | 1.0 | 1.0 |
| | | 2-ethyl-4-methylimidazole | 1.0 | 1.0 | 1.0 | 1.0 | 1.0 | | |
| | | carnauba wax | 1.5 | 1.5 | 1.5 | 1.5 | 1.5 | 1.5 | 1.5 |
| | | silane coupling agent | 1.2 | 1.2 | 1.2 | 1.2 | 1.2 | 1.2 | 1.2 |
| Test | Heat loss | 180° C. × 4 hr (%) | 0.5 | 0.6 | 1.6 | 1.5 | 0.9 | 4.4 | 0.2 |
| | Tracking resistance | CTI, droplet count @ 600V (droplets) | >50 | >50 | >50 | 43 | >50 | >50 | 12 |

TABLE 1-continued

| Formulation (parts by weight) | | Example | | | | Comparative Example | | |
|---|---|---|---|---|---|---|---|---|
| | | 1 | 2 | 3 | 4 | 1 | 2 | 3 |
| Void formation upon curing | visual observation | ○ | ○ | ○ | ○ | Δ | X | ○ |

The data in Table 1 demonstrate that the resin compositions of Examples 1 to 4 show minimized volatilization, controlled void formation upon curing, and satisfactory tracking resistance.

Japanese Patent Application No. 2017-217201 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silicone-modified epoxy resin composition comprising:
(A) a silicone-modified epoxy resin having at least two epoxy groups, obtained from hydrosilylation reaction of an alkenyl-containing epoxy compound with an organopolysiloxane having the average compositional formula (1):

wherein R is each independently a $C_1$-$C_{10}$ monovalent hydrocarbon group, a is a positive number: $0.01 \leq a \leq 1$, b is a positive number: $1 \leq b \leq 3$, meeting $1.01 \leq a+b < 4$,
(B) a silicone-modified phenolic resin having at least two phenolic hydroxyl groups, obtained from hydrosilylation reaction of an alkenyl-containing phenol compound having the formula:

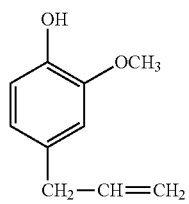

with an organopolysiloxane having the average compositional formula (1),
(C) a black pigment, and
(D) an inorganic filler exclusive of the black pigment (C).

2. The silicone-modified epoxy resin composition of claim 1 wherein the organopolysiloxane in components (A) and (B) is at least one compound selected from compounds having the formulae (a), (b) and (c):

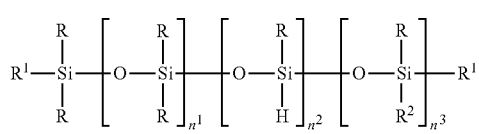

wherein R is as defined above, $R^1$ is hydrogen or a group as defined for R, $n^1$ is an integer of 0 to 200, $n^2$ is an integer of 0 to 2, $n^3$ is an integer of 0 to 10, with the proviso that $n^1$, $n^2$ and $n^3$ are not equal to 0 at the same time, and $R^2$ is a group having the formula (a'):

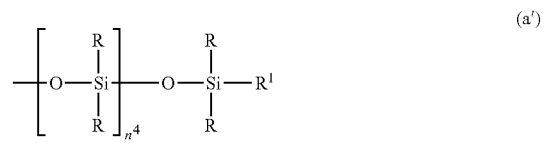

wherein R and $R^1$ are as defined above, $n^4$ is an integer of 0 to 10, siloxane units each in brackets may be randomly bonded or form blocks, the compound of formula (a) containing at least two silicon-bonded hydrogen atoms per molecule,

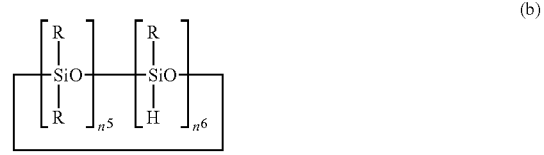

wherein R is as defined above, $n^5$ is an integer of 0 to 10, $n^6$ is an integer of 2 to 4, meeting $3 \leq n^5+n^6 \leq 12$, the arrangement of siloxane units each in brackets is not limited,

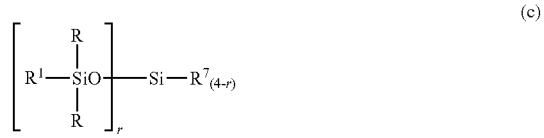

wherein R and $R^1$ are as defined above, r is an integer of 0 to 3, and $R^7$ is hydrogen or a $C_1$-$C_{10}$ organic group, the compound of formula (c) containing at least two silicon-bonded hydrogen atoms per molecule.

3. The silicone-modified epoxy resin composition of claim 1 wherein the inorganic filler (D) is present in an amount of 150 to 1,500 parts by weight per 100 parts by weight of components (A) and (B) combined and 60 to 94% by weight of the total weight of the composition.

4. A semiconductor device encapsulated with a cured product of the silicone-modified epoxy resin composition of claim 1.

5. The silicone-modified epoxy resin composition of claim 1 wherein the inorganic filler (D) has a chloride ion content of up to 10 ppm and a sodium ion content of up to 10 ppm, when impurities are extracted from the filler in a concentration of sample 10 g/water 50 g under conditions: 125° C., 2.1 atm., and 20 hours.

\* \* \* \* \*